(12) United States Patent
Chih et al.

(10) Patent No.: US 7,527,860 B2
(45) Date of Patent: May 5, 2009

(54) VERTICAL ALIGNED NANO-SCALE DIAMOND STRUCTURE AND PROCESS FOR FABRICATING THE SAME

(75) Inventors: Ya-Ko Chih, Yingge Township, Taipei County (TW); Jenn-Chang Hwang, Hsinchu (TW); Chwung-Shan Kuo, Hsinchu (TW); Da-Jeng Yao, Hsinchu (TW); Chien-Hsun Chen, Tainan (TW); An-Ping Lee, Keelung (TW); Chi-Ming Hung, Kaohsiung County (TW)

(73) Assignee: National Tsing Hua University, Hsinchu (TW)

( * ) Notice: Subject to any disclaimer, the term of this patent is extended or adjusted under 35 U.S.C. 154(b) by 425 days.

(21) Appl. No.: 11/068,254

(22) Filed: Feb. 28, 2005

(65) Prior Publication Data

US 2006/0104885 A1  May 18, 2006

(30) Foreign Application Priority Data

Nov. 12, 2004 (TW) ............... 93134588 A

(51) Int. Cl.
*B32B 9/00* (2006.01)
(52) U.S. Cl. ............................... 428/408
(58) Field of Classification Search ............... 428/408; 423/445 R, 447.1, 447.2; 977/742
See application file for complete search history.

(56) References Cited

U.S. PATENT DOCUMENTS 6,958,571 B2 * 10/2005 Nishibayashi et al. ....... 313/309

OTHER PUBLICATIONS

Chih (Diamond and Related Materials 13 (2004) 1614-1617).*
J.E. Graebner, S. Jin, et al., "Large anisotropic thermal conductivity in synthetic diamond films," paper: Nature, dated Oct. 1992, vol. 359 pp. 401-403.
K. Kobashi, T. Tachibana, et al., "Fibrous structures on diamond and carbon surfaces formed by hydrogen plasma under direct-current bias and field electron-emission properties," J. Mater. Res., vol. 18, No. 2, dated Feb. 2003, pp. 305-326.
P.W. May, C.A. Rego, et al., "CVD diamond wires and tubes," Diamond and Related Materials, 3 (1994) pp. 810-813.
A.A. Morrish, J.W. Glesener, et al., "Diamond tubes and fibers," Diamond and Related Materials, 3 (1993) pp. 173-176.
F.P. Incropera and D.P. DeWitt, "Fundamentals of Heat and Mass transfer" One Dimensional, Steady-State Conduction, Ch. 3, pp. 136, published 2001.
V.M. Dubin, "Electrochemical aspects of new materials and technologies in microelectronics," Microelectronics Engineering 70 (2003) pp. 461-469.

* cited by examiner

*Primary Examiner*—Keith D Hendricks
*Assistant Examiner*—Daniel Miller
(74) *Attorney, Agent, or Firm*—Bucknam and Archer

(57) ABSTRACT

A vertical aligned nano-scale diamond structure comprising diamond nanotip or nanotube is provided. More particularly, apparatus and method are disclosed for depositing such diamond structure on a rugged polycrystalline substrate.

2 Claims, 6 Drawing Sheets

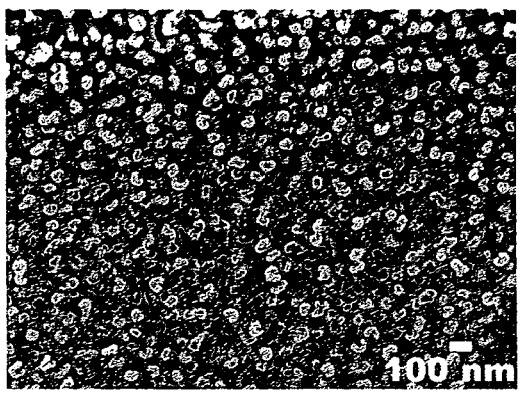
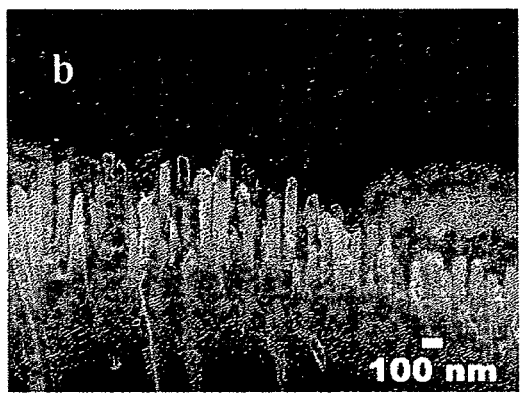
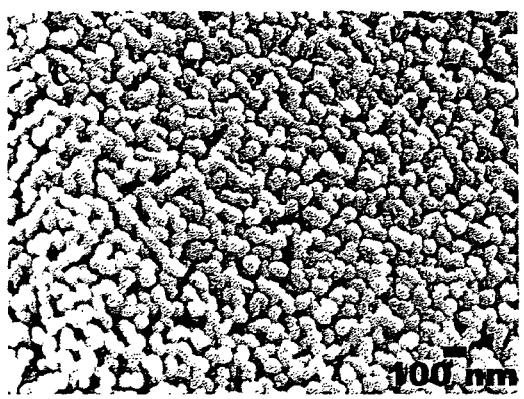
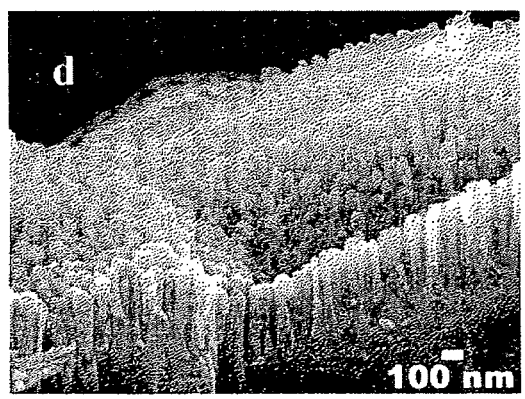
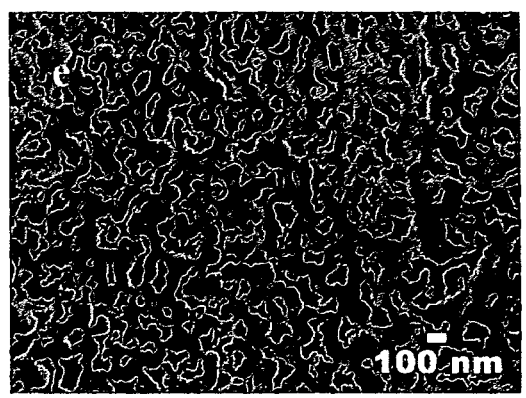
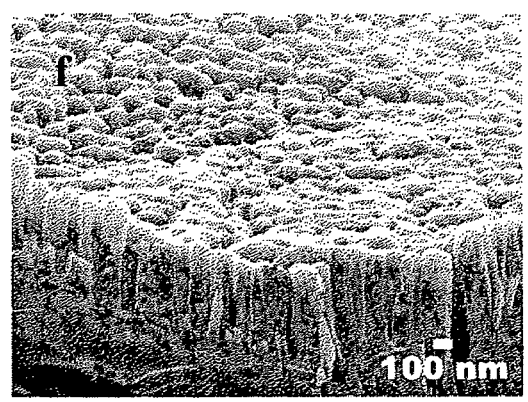
Fig. 1(a)~(f)

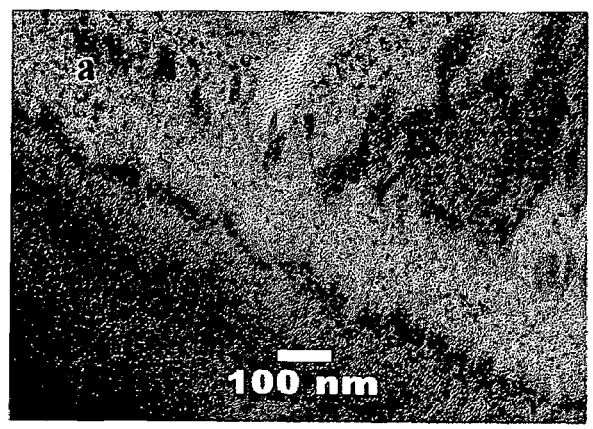
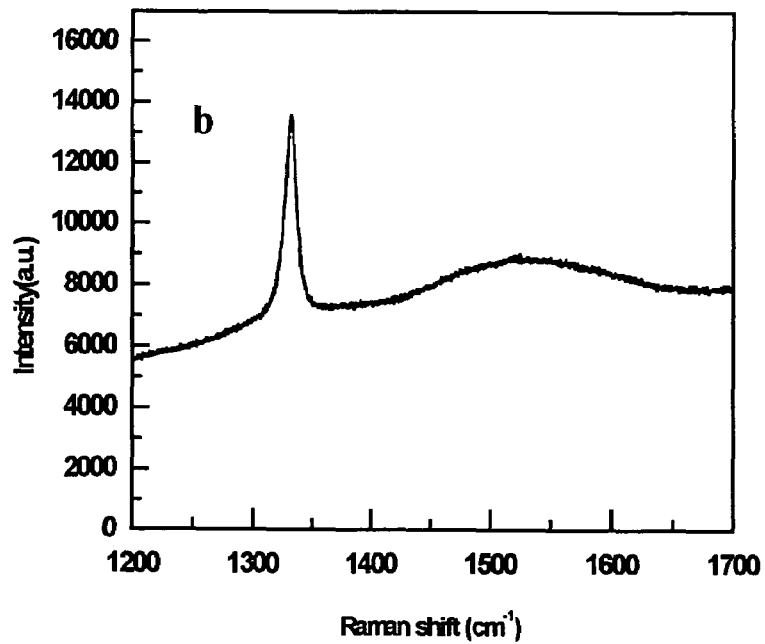
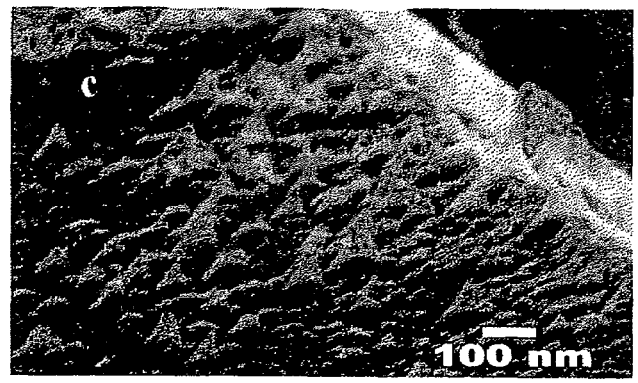
Fig. 3(a)~(c)

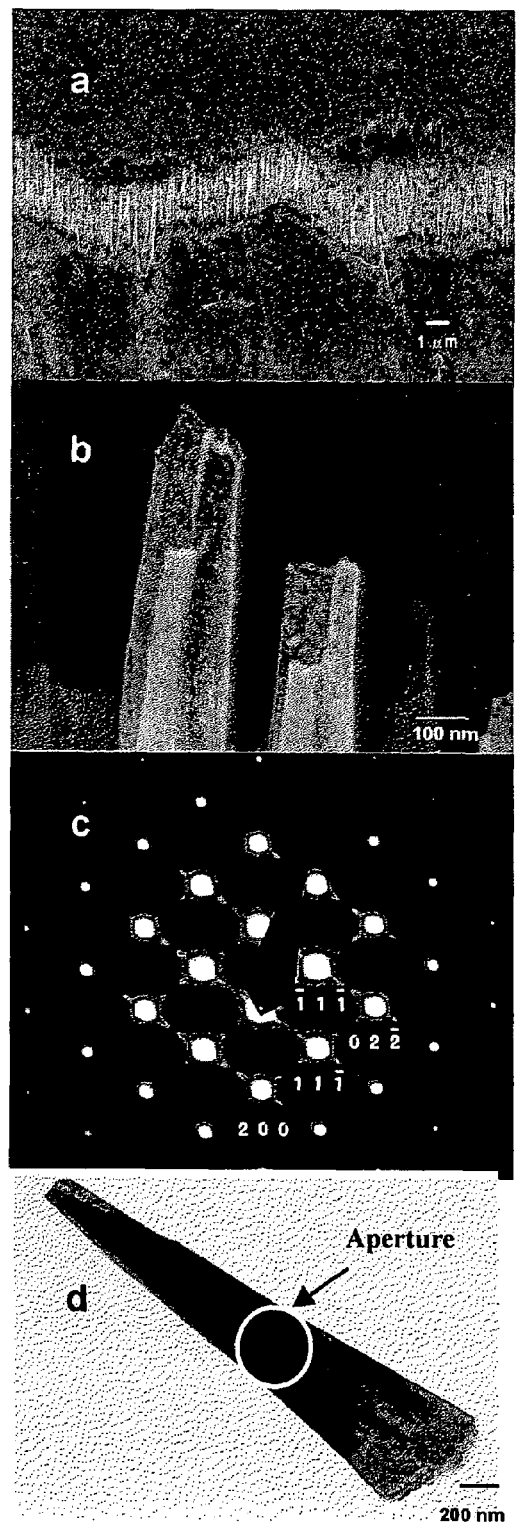
Fig.4(a)~(d)

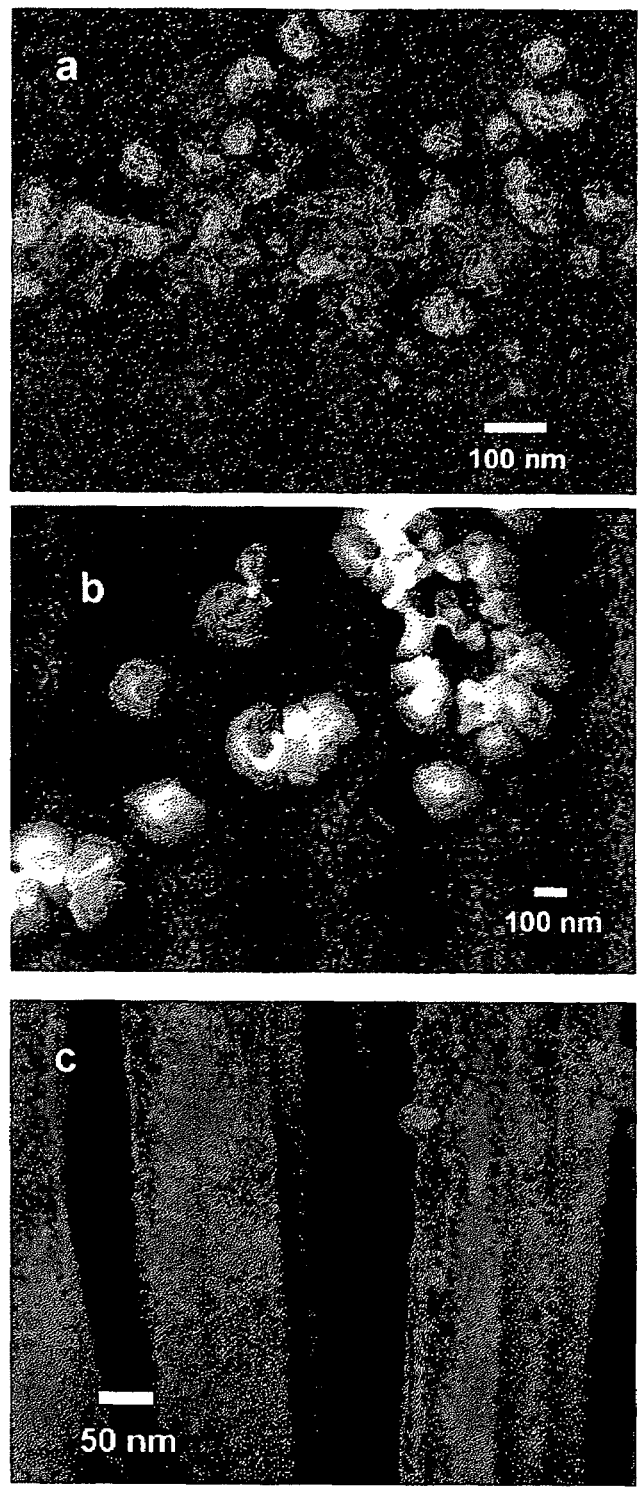
Fig.5(a)~(c)

VERTICAL ALIGNED NANO-SCALE DIAMOND STRUCTURE AND PROCESS FOR FABRICATING THE SAME

FIELD OF THE INVENTION

This invention pertains to a vertical aligned nano-scale diamond structure comprising diamond nanotips or nanotubes. More particularly, apparatus and method are disclosed for depositing such diamond structure on a rugged polycrystalline substrate. The structure at least may be used as heat spreader in microelectronic devices.

DESCRIPTION OF THE PRIOR ART

Diamond is a special material with high mechanical hardness, thermal conductivity, electron and hole molibilities, and chemical stability, which make more attractive the fabrication of diamond nanotips or nanotubes in the thermal application.

The diamond films has been usually nucleated and grown on commercially available single-crystal silicon substrate by microwave-enhanced plasma chemical vapour deposition (MEPCVD), which has been disclosed by J. A. Graebner, et al., in the paper "Large anisotropic thermal conductivity in synthetic diamond films," Nature, vol. 359, (1992)410. The synthesis of diamond is a high temperature (~900° C.) process, at which temperature the synthesized diamond is always in a form of film, rather than of nanotip or nanotube. In addition, previous MPECVD work by K. Kobashi, et al., J. Mater. Res. 18(2003)305, demonstrated that fibrous, rather than tubular or tip-like, structure can be obtained at temperatures ranging from 300 to 400° C. Their fibrous diamond structure consists of randomly oriented diamond nanocrystals, which are obtained in microwave plasma of hydrogen at 1.6 torr and a negative direct-current bias of −150 to −300 V without metal catalyst. However, the surface of the fibrous diamond structure is covered with an amorphous layer.

The formation of another nano-scale diamond structure such as tubes has been considered impossible since $sp^3$ bonds have no sheet feature like $sp^2$ ones. Usually, the diamond tubular structure formed as $sp^3$ bonds were fabricated by diamond coating on fiber structure of silicon carbide, copper, tungsten, and titanium, and followed by the subsequent removal of the fiber substrate, which have been disclosed by P. W. May, C. A. Rego, et al., Diamond and Related Materials, 3(1994)810, and by A. A. Morrish, et al., Diamond and Related Materials, 3(1993)173. They reported smallest size of the tubular structure of diamond was in the range of 50-150 μm, about several thousands of times larger than that of a typical CNT.

Synthetic diamond films are being considered as an excellent material of heat spreader for the prevention from thermal damage due to its high thermal conductivity (22 $Wcm^{-1}K^{-1}$). An excellent heat spreader for high power devices should exhibit not only high thermal conductance to transfer heat to the surface but also a fin structure of large surface area to dissipate heat away, which is discussed in detail in a textbook such as F. P. Incropera and D. P. Dewitt, "Fundamentals of Heat and Mass Transfer," John Wiley, $4^{th}$ ed, New York, 1996, p. 136. In the past decades, most commercial heat spreaders have been made of copper and Al, (V. M. Dubin, Microelectronic Engineering vol 70, (2003) 461.) rather than made of diamond, based on the following reasons. First, both copper and Al are cheaper than diamond. Second, both copper and Al are ductile and easy to make different fin structures at low cost. Third, diamond is brittle and difficult to machine a fin structure of large surface area. Recently, the progresses of high power devices and high density of electronic packaging have intensified the heat dissipation problem and also stimulate the need of a diamond heat spreader. Therefore, It is of economic interest to find a simple and low-cost way to fabricate a nano-scale diamond structure such as nanotips or nanotubes on top of a polycrystalline substrate. The nanoscale diamond structure can play the role of a fin structure of large surface area to satisfy the requirements for an excellent heat spreader.

SUMMARY OF THE INVENTION

The first object of this invention is to provide a vertical aligned nano-scale diamond structure such as diamond tips or tubes, wherein the structure is deposited on a rugged substrate.

The vertical aligned diamond nanotips of ~50±20 nm in diameter and ~600±200 nm in length (FIGS. 1a and 1b) were grown on the rugged polycrystalline diamond/silicon substrates at about 125° C. and a bias voltage of about −250 V. The aspect ratio of diamond nanotips is about 12:1 in average. Each diamond nanotips exhibits C-shape at its top and the tip density is about $1.5 \times 10^{10}$ $cm^{-2}$ as shown in the top-view SEM micrograph (FIG. 1(a)). The C-shape is considered to be a metastable shape since it does not have the smallest surface area of a tip structure. When substrate temperature is raised to 200° C., the C-shape disappears and becomes a rod-like shape as shown in FIG. 1(c). The diameter of a rod-like-shape diamond nanotip is ~60±20 nm, slightly larger than that of a C-shape one. The lengths of diamond nanotips are about the same (FIG. 1(d)).

The vertical aligned diamond nanotubes (FIG. 4a) of ~125±35 nm in outermost diameter and ~3±0.5 μm in length were grown on the rugged polycrystalline diamond substrate; wherein the density is approximately $9 \times 10^8$ $cm^{-2}$. All the diamond nanotubes are almost vertically aligned onto the slant surface of the polycrystalline diamond grains. The tubular structure of a diamond tube is clearly revealed in its fracture's image (FIG. 4b), prepared by diamond cutting. The wall thickness of a diamond nanotube is approximately 30 nm thick and its inner diameter approximately 100 nm. Each diamond nanotube is single crystalline and typically 50-160 nm in size. The polycrystalline diamond substrate is approximately 90 μm thick and 5×5 $mm^2$ in size.

The second object of this invention is to provide processes for fabricating such nanotips and nanotubes.

Diamond nanotips were grown on polycrystalline diamond/silicon (D/Si) substrates in a 2.54 GHz planar microwave plasma enhanced chemical vapor deposition (MPECVD) system. The characteristics of the planar-MPECVD system can be found in the previous published paper, Rev. Sci. Instrum. 70 (1999) 2331. In a typical experiment, planar-MPECVD chamber was pumped down to a base pressure of $4 \times 10^{-2}$ Torr, and a mixture of 30% $CH_4$ and 70% $H_2$ was fed into the chamber to ignite the $CH_4/H_2$ mixed plasma at 3000 W and at a total pressure of 0.17 Torr. Nanoscale diamond tips were grown on the polycrystlline D/Si substrates at different substrate temperature (125° C.; 200° C. and 350° C.) and different bias voltages (−50V, −150V, and −250V) for 2 hours. The growth of diamond nanotips is very sensitive to substrate temperature and bias voltage.

Diamond nanotubes were synthesized on polycrystalline diamond film without silicon substrate at bias voltage of −50 to −250V in a 2.54 GHz planar MPECVD system. In a typical experiment, MPECVD chamber was pumped down to a base pressure of $3.5 \times 10^{-3}$ torr, and a mixture of 30% $CH_4$ and 70% $H_2$ was fed into the chamber to ignite the $CH_4/H_2$ mixed plasma at 3,000 W and at a total pressure of 0.13 Torr. The process time ranges from 0.5 to 2 hour. The substrate temperature Ts was heated by plasma bombardment during growth and determined to be ~200° C. at the end of each run.

The aspect ratio of a diamond nanotube can be fine-tuned by the applied bias voltage. When the bias voltage decreases, the diameter and length of a diamond nanotube decrease. The outermost diameter and the length of a typical diamond nanotube reduce down to ~50 nm and ~0.2 µm at a bias voltage of −50 V, respectively. The aspect ratio reduces to 4:1 at −50 V. When the bias voltage is further reduced to zero, the tubular structure of the diamond disappears.

Another object of this invention is to provide a diamond heat spreader made of nano-scale structure which provides extended surface area to dissipate heat away and makes itself to be a good fin structure.

The nano-scale diamond structure are about ~3 µm in height and exhibits a high aspect ratio of about 24:1, the heat spreading performance of the nano-scale diamond structure/ diamond structure is much better than that of a flat diamond one.

The fabricating the nano-scale diamond heat spreader are more simple and economic, easy to carry out and without catalyst, particularly the nano-scale diamond structure as heat spreader can be self-grown on the polycrystalline diamond film, which can overcome two problems. First, the nano-scale diamond structure /diamond structure does not require any adhesive technology to bind together nano-scale diamond structure and diamond because it is a self-growth process. Second, the diamond heat spreader of small size is enough to dissipate heat away because diamond exhibits high thermal conductivity.

The form of nano-scale diamond structures can be tube or tip. The nano-scale diamond structure can be a single crystal diamond or a polycrystalline diamond. The substrate can be a polycrystalline diamond film, a single crystal diamond film, or a diamond film/silicon.

BRIEF DESCRIPTION OF THE DRAWINGS

In the text which follows, the invention is described by way of example on the basis of the following exemplary embodiments:

FIG. 1 are Field Emission scanning electron micrographs at a magnification of 50000 showing the diamond nanotips grown at (a) 125° C., plane view; (b) 125° C., side view; (c) 200° C., plane view; (d) 200° C., side view; (e) 350° C., plane view; (f) 350° C., side view.

FIG. 3 comprises (a) Side view FESEM micrograph showing the diamond nanotips grown at −150V; (b) Raman spectrum of the diamond nanotips in (a), and; (c) Side view FESEM micrograph showing the diamond nanotips grown at −50V.

FIG. 4a is Field emission scanning electron micrograph showing vertically aligned DNTs on the polycrystalline diamond substrate.

FIG. 4b is Field emission scanning electron micrograph showing the fractured surface of a NDT.

FIG. 4c is Electron diffraction pattern of a NDT, the zone axis of the pattern is [011].

FIG. 4d is TEM micrograph of a single NDT.

FIG. 5 are Sequential morphologies of NDTs at the different stage of the growth; (a) 15 min.; top view; (b) 30 min.; top view; (c) 60 min.; side view.

DETAILED DESCRIPTION OF THE INVENTION

Diamond nanotips and nanotubes are grown on a rugged polycrystalline substrates in a planar microwave plasma enhanced chemical vapor deposition (MPECVD) system. Followings are preferable embodiments to perform the diamond nanotips and nanotubes according to this invention.

EXAMPLE A

Diamond Nanotips

Experimental Procedure

Diamond nanotips were grown on polycrystalline diamond/silicon (D/Si) substrates in a 2.54 GHz planar microwave plasma enhanced chemical vapor deposition (MPECVD) system. The polycrystalline D/Si substrate is about 540 µm thick and 5×5 mm$^2$ in size. A planar-MPECVD chamber was pumped down to a base pressure of 4×10$^{-2}$ Torr, and a mixture of 30% $CH_4$ and 70% $H_2$ was fed into the chamber to ignite the $CH_4/H_2$ mixed plasma at 3000 W and at a total pressure of 0.17 Torr. Nano-scale diamond tips were grown on the polycrystlline D/Si substrates at different substrate temperature (125° C.; 200° C. and 350° C.) and different bias voltages (−50V, −150V, and −250 V) for 2 hours. No metal catalysts are required for the growth at such low temperature. A field emission scanning electron microscope (FESEM) image was obtained by flashing ultra-thin Au onto nano-scale diamond tips because the tips are not conductors. Raman spectroscopy was used for the chemical analysis of nano-scale diamond tips.

Results and Discussion

Vertically aligned diamond nanotips of ~50±20 nm in diameter and ~600±200 nm in length (FIGS. 1(a) and 1(b)) were grown on the rugged polycrystalline diamond/silicon substrates at 125° C. and a bias voltage of −250 V. The aspect ratio of diamond nanotips is about 12:1 in average. Each diamond nanotips exhibits C-shape at its top and the tip density is about 1.5×10$^{10}$ cm$^{-2}$ as shown in the top-view SEM micrograph (FIG. 1(a)). The C-shape is considered to be a metastable shape since it does not have the smallest surface area of a tip structure. When substrate temperature is raised to 200° C., the C-shape disappears and becomes a rod-like shape as shown in FIG. 1(c). The diameter of a rod-like-shape diamond nanotip is ~60±20 nm, slightly larger than that of a C-shape one. The lengths of diamond nanotips are about the same (FIG. 1(d)). When substrate temperature is increased to 350° C., diamond nanotips exhibit larger diameters and they bind together to form a film with lots of nano-scale pinholes, as shown in FIGS. 1(e) and 1(f). This indicates that a tip structure is easier to form at a low temperature process.

Figure 2:
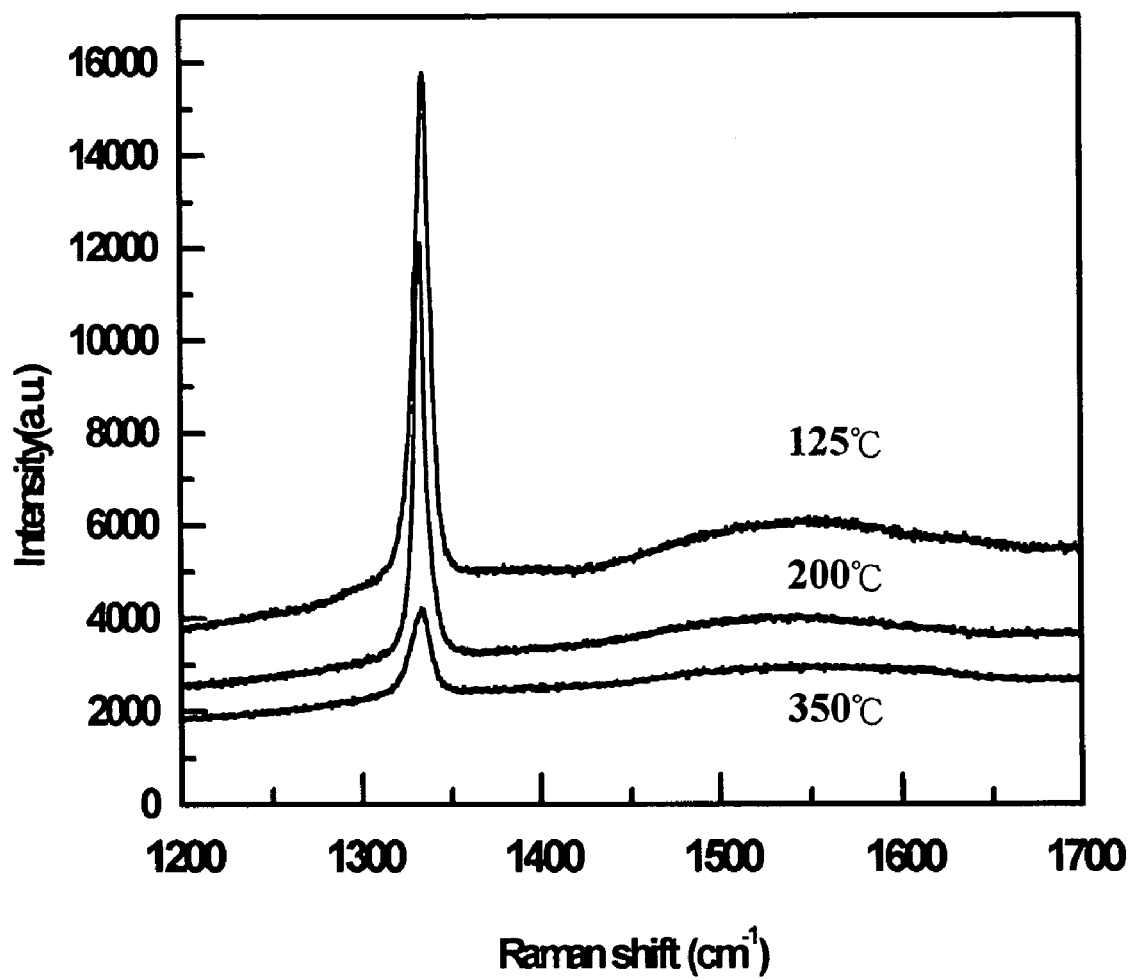
FIG. 2 is Raman spectra of diamond nanotips grown at different substrate temperatures.

The diamond qualities of nanotips grown at different substrate temperatures can be extracted from their Raman spectra in FIG. 2. The nanotips grown at 125° C. exhibit a strong diamond characteristic peak at 1334 cm$^{-1}$ and a very weak graphite background centered at 1580 cm$^{-1}$ (G band). The co-existence of sp$^2$ or graphite bonding in diamond would shift the Raman frequency to a frequency higher than 1332 cm$^{-1}$. The 1334 cm$^{-1}$ position is thus an indication of the existence of very small amount of sp$^2$ or graphite bonding. However, the Raman cross-sections for graphite to diamond is about 50:1 per unit volume. The nanotips in FIG. 1(a)-1(b) are thus reasonably treated as diamond nanotips. The very weak G band is a sign of the existence of a very small amount of sp$^2$ or graphite bonding. The G band results from the stretching vibration of any pairs of sp$^2$ sites, whether in C=C chains or in aromatic rings. Usually, a broad D band centered at 1350 cm$^{-1}$ coexists with the G band for amorphous carbon films grown in a MPECVD system. D band is the breathing mode of sp$^2$ sites only in aromatic rings. The disappearance of D bands in FIG. 2 suggests that all the sp$^2$ sites in diamond nanotips are in chains, not in rings. When substrate temperature is raised from 125 to 200° C., the diamond characteristic peak shifts from 1334 to 1332 cm$^{-1}$ and its full-width-at half maximum (FWHM) reduced from 10.1 to 6.6 cm$^{-1}$. The peak area ratio I(diamond)/I(G) also increases from 0.93 to 1.23. All these support that diamond nanotips have better diamond quality at 200° C. than at 125° C. Note that the diamond nanotips become rod-like shape at 200° C. One possible explanation is the reduction of surface energy that makes a C-shape nanotip of high surface area being replaced by a rod-like structure of small surface area. When substrate temperature increases further to 350° C., the diamond characteristic peak becomes weak and broad and the peak area ratio I(diamond)/I(G) also reduce to 0.51. This indicates that the diamond film in FIGS. 1(e) and 1(f) has the worse diamond quality. The coalescence of nanotips is also clearly observed which leads to the formation of a film-like structure as shown in FIG. 1(e).

Bias voltage is very crucial in the growth of diamond nanotips on the rugged polycrystalline diamond surfaces. When bias voltage reduces from −250 to −150 V, the C-shape diamond nanotips no longer exist. All the diamond nanotips are vertically aligned and in cone-shape, as shown in FIG. 3 (a). And their Raman spectrum (FIG. 3(b)) exhibits diamond characteristic peak at 1333 cm$^{-1}$ and a weak and broad graphite background centered at 1580 cm$^{-1}$. The I(diamond)/I(G) ratio is determined to be 0.59, smaller than that 0.93 taken at −250 V bias voltage. The FWHM of the diamond peak is 11.0 cm$^{-1}$, larger than 10.1 taken at −250 V bias voltage. All these indicate that C-shape diamond nanotips have better diamond quality than cone-shape ones. When bias voltage reduces further to −50 V, the cone-shape diamond nanotips remain stable, as shown in FIG. 3(c). However, their nucleation density tremendously reduces and nanotips are no longer uniformly cover the rugged polycrystalline diamond surface. No Raman spectrum from the nanotips in FIG. 3(c) can be detected.

EXAMPLE B

Diamond Nanotubes

Experimental Procedure

NDTs were synthesized on polycrystalline diamond substrate at bias voltage of −50 to −250 V in a 2.54 GHz planar microwave plasma enhanced chemical vapor deposition (MPECVD) system. The polycrystalline diamond substrate is approximate 90 μm thick and 5×5 mm$^2$ in size. In a typical experiment, MPECVD chamber was pumped down to a base pressure of 3.5×10$^{-3}$ torr, and a mixture of 30% CH$_4$ and 70% H$_2$ was fed into the chamber to ignite the CH$_4$/H$_2$ mixed plasma at 3,000 W and at a total pressure of 0.13 torr. The process time ranges from 0.5 to 2 hour. The substrate temperature Ts was heated by plasma bombardment during growth and determined to be ~200° C. at the end of each run. No metal catalysts are required to grow NDTs at such low temperature. A transmission electron microwaves (TEM, JEM-4000EX, operated at 400 kV) was used to characterize the morphologies and crystal structures of NDTs. A better field emission scanning electron microscope (FESEM) image was obtained by flashing ultra-thin Au onto NDTs since NDTs are not conducting.

Results and Discussion

Vertically aligned NDTs (nano-scale diamond tubes) (FIG. 4a) of ~125±35 nm in outermost diameter and ~3±0.5 μm in length were grown on the rugged polycrystalline diamond substrate biased at −250 V for 2 h. NDTs are formed uniformly on the polycrystalline diamond substrate. The density of NDTs is approximately 9×10$^8$ cm$^{-2}$. All the NDTs are almost vertically aligned onto the slant surfaces of the polycrystalline diamond grains. The tubular structure of a diamond tube is clearly revealed in its fracture's image (FIG. 4b), prepared by diamond cutting. The wall thickness of NDT is approximately 30 nm thick and its inner diameter approximately 100 nm.

The structure of the NDTs can be identified from the electron diffraction (ED) pattern (FIG. 4c), taken by positioning an aperture covering the center part of a single NDT (FIG. 4d) scratched from the NDTs/diamond interface. Only discrete ED spots without amorphous carbon rings were observed in the ED pattern. The NDT is thus expected to be a single crystalline structure. The discrete ED spots are indexed and identified to be a single crystalline diamond structure looking along [011] zone axis. The streaks along [11$\bar{1}$] and [$\bar{1}$1$\bar{1}$] directions with extra spots displaced from matrix spots by one third along <111> directions is an indication of the existence of twins. When we adjust the zone axis along <111>, the streaks in the ED pattern disappear. This indicates that the twin planes are {111} inside the NDTs. Usually, the information of the twins is induced by a shear stress on the twin plane inside a single crystal. The observation of {111} twins in the NDTs is an indication of the existing shear stress built inside the NDTs during synthesis. In other words, sp$^3$ bonds inside the NDTs may be stretched or titled during synthesis. We speculate that the strain energy built in each NDT is released partially at least by the formation of {111} twins.

The aspect ratio of a NDT can be fine-tuned by the applied bias voltage. When the bias voltage decreases, the diameter and length of a NDT decrease. The outermost diameter and the length of a typical NDT reduce down to ~50 nm and ~0.2 μm at a bias voltage of −50 V, respectively. The aspect ratio reduces to 4:1 at −50 V. When the bias voltage is further reduced to zero, the tubular structure of the diamond disappears. This suggests that the tubular structure of NDTs is enhanced by the applied bias voltage.

The information of the tubular structure of NDTs can be well explained by the coalescence mechanism, rather than the roll-up or blending of sp$^3$ bonds. FIG. 5 shows the sequential morphologies of the vertically aligned NDTs (FIG. 4) at its initial stage of growth. At 15 min, diamond crystalline of size ranging from 5 to 100 nm start to nucleate on the valley areas between diamond grains of micro size (FIG. 5a). Here, we define diamond nanodots as diamond crystallites of size less than 100 nm, and diamond dots higher than 100 nm. At 30 min, diamond nanodots disappear and diamond dots of approximately 150 nm in size (FIG. 5b) exhibit all over the polycrystalline diamond substrate. It seems that the diamond dots have a tendency to bind together in pairs with grooves left at the boundary by the coalescence mechanism. More-over, several pairs of diamond dots coalesce in a circle to form a short tubular structure of ~600 nm in outermost diameter. The outermost diameter here is approximately five times larger than ~125 nm observed in FIG. 4a. This is consistent with the shape of NDT, which is in cone shape and wider at the bottom part. Another evidence to support the proposed coalescence mechanism is the observation of the groove structures in vertically aligned NDTs as shown in FIG. 5c, which is the side view of NDTs.

The driving force for the coalescence mechanism is attributed to the reduction of high surface energy of diamond, similar to that in sintering. Experimental data in FIG. 5 favor the coalescence mechanism at the initial stage of NDT formation. This implies that reduction of the high surface energy can be drive diamond nanodots or dots (FIG. 5a,b) to move around on the basal diamond surface at the initial stage of NDT formation. However, it is not clear if the coalescence mechanism continues after the initial formation of NDTs. The tubular structure of NDTs may continue to grow due to bias voltage, rather that coalescence.

EXAMPLE C

Heat Spreader

Figure 6:
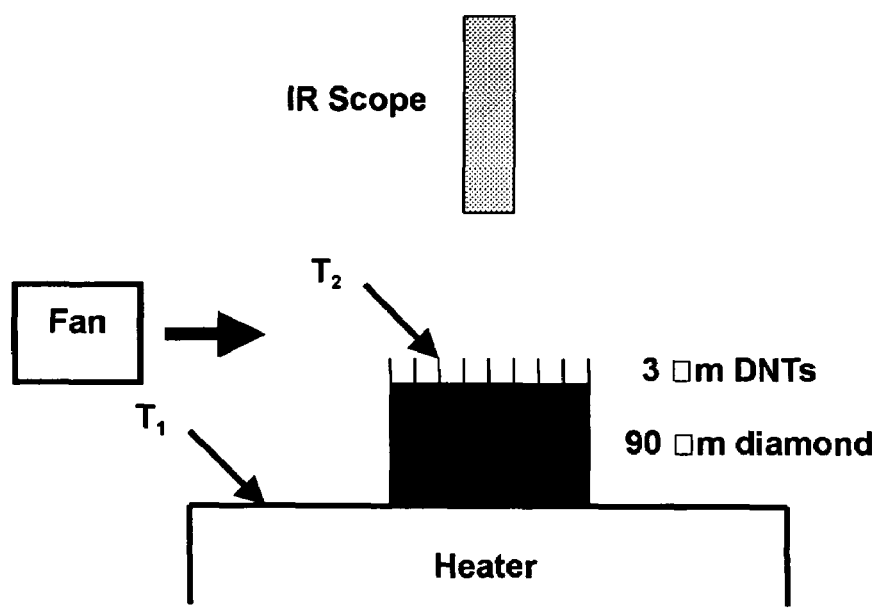
FIG. 6 is a sketch of IR apparatus to detect the heat spreading performance of NDTs according to this invention.
Figure 7:
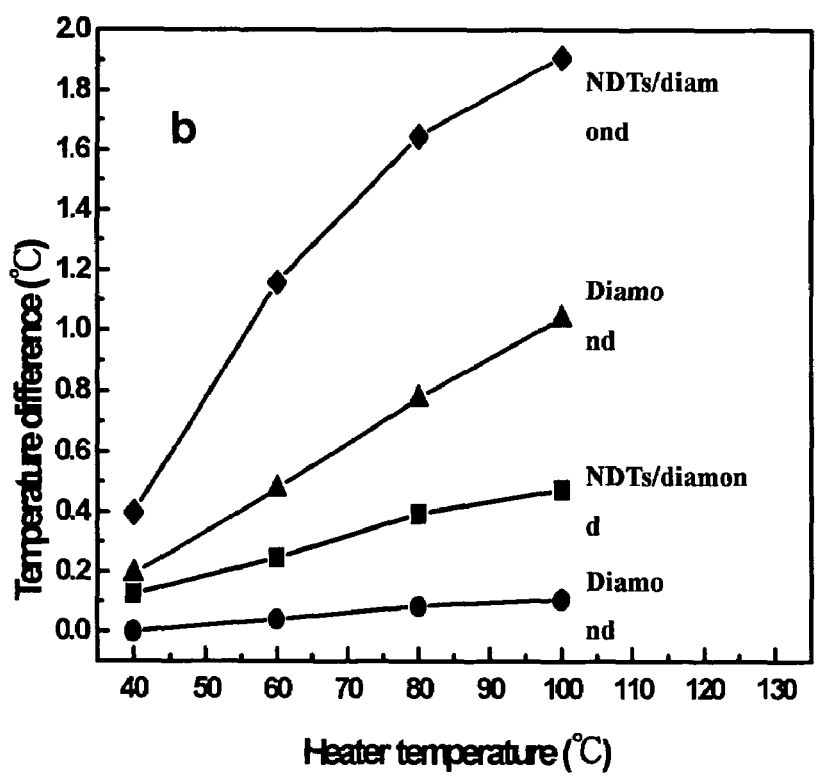
FIG. 7 is a profile of experimental data detected by IR apparatus under different conditions, the effective conductivity of NDTs are superior to that of a diamond film whenever a fan is or not used.

The heat spreading performance of NDTs according to this invention is shown in FIG. 7, and IR apparatus to detect that is arranged as FIG. 6. As shown in FIG. 6, a heat spreader made of NDTs lay upon the plate of IR detector, which a specific temperature of plate is set, and the surface temperature of heat spreader, Ts, is detected by IR, therefore the temperature difference between the plate and Ts is calculated and the heat spreading performance for the heat spreader also can be achieved. In order to change the conditions and to observe the results when the forced convention of heat is applied by using an air fan, the heat spreading performance for the heat spreader due to several times of area for heat transfer, namely fins of NDTs, becomes more obvious than that of a diamond film.

As shown in FIG. 7, the heat spreading performance of NDTs/diamond according to this invention is superior to that of a single diamond film in several times of effective conductivity. When a fan is applied in the system, i.e., the heat transfer mechanism between the region of NDTs fins and air flow is changed to forced convention, apparently the speed of heat spreading increases, and directly proves that the nano-scale tubular diamond plays a key role for such heat transfer mechanism.

The invention has been described with reference to its preferred embodiments. Those of ordinary skill in the art may, upon reading this disclosure, appreciate changes or modifications which do not depart from the scope and spirit of the invention as described above or claimed hereafter.

What is claimed is:

1. A nano-scale diamond tube structure obtained by conducting a microwave plasma enhanced chemical vapor deposition (MPEVCD) on a substrate selected from the group consisting of a polycrystalline diamond film, a single diamond film and a diamond/silicon film, under conditions of a substrate temperature of 100~300° C. and a bias voltage of −50~250 V, which is characterized in that the diamond tube structure is a single crystal diamond vertically aligned on the substrate, and has an outermost diameter of about 125 nm, an inner diameter of about 100 nm, a length of about 3.5 μm and a wall thickness of about 30 nm.

2. A diamond heat spreader made of nano-scale diamond tube according to the diamond tube structure of claim 1, comprising extended surface area to dissipate heat away.

* * * * *

UNITED STATES PATENT AND TRADEMARK OFFICE
CERTIFICATE OF CORRECTION

PATENT NO.       : 7,527,860 B2  
APPLICATION NO.  : 11/068254  
DATED            : May 5, 2009  
INVENTOR(S)      : Chih et al.

Page 1 of 1

It is certified that error appears in the above-identified patent and that said Letters Patent is hereby corrected as shown below:

Cover page, Item [75], please change "Chwung-Shan Kuo" to correctly read: --Chwung-Shan Kou--.

Signed and Sealed this

Eleventh Day of August, 2009

David J. Kappos  
*Director of the United States Patent and Trademark Office*